(12) United States Patent
Miyamoto et al.

(10) Patent No.: US 8,912,302 B2
(45) Date of Patent: Dec. 16, 2014

(54) CURABLE SILICONE COMPOSITION FOR SEALING AN OPTICAL SEMICONDUCTOR ELEMENT, METHOD OF PRODUCING A RESIN-SEALED OPTICAL SEMICONDUCTOR ELEMENT, AND RESIN-SEALED OPTICAL SEMICONDUCTOR ELEMENT

(71) Applicant: Dow Corning Toray Co., Ltd., Tokyo (JP)

(72) Inventors: Yusuke Miyamoto, Ichihara (JP); Makoto Yoshitake, Ichihara (JP)

(73) Assignee: Dow Corning Toray Co., Ltd., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/346,129

(22) PCT Filed: Sep. 18, 2012

(86) PCT No.: PCT/JP2012/074601
§ 371 (c)(1),
(2), (4) Date: Mar. 20, 2014

(87) PCT Pub. No.: WO2013/042794
PCT Pub. Date: Mar. 28, 2013

(65) Prior Publication Data
US 2014/0235806 A1 Aug. 21, 2014

(30) Foreign Application Priority Data
Sep. 21, 2011 (JP) ................. 2011-205480

(51) Int. Cl.
*C08G 77/12* (2006.01)
*C08G 77/20* (2006.01)
(Continued)

(52) U.S. Cl.
CPC .............. *C08F 30/08* (2013.01); *C08L 83/04* (2013.01); *H01L 33/0095* (2013.01);
(Continued)

(58) Field of Classification Search
CPC ........ C08G 77/20; C08G 77/12; C08L 83/04; C08L 30/08; H01L 33/0095
USPC .............................. 528/32; 526/126; 264/1.24
See application file for complete search history.

(56) References Cited

U.S. PATENT DOCUMENTS 7,649,059 B2 * 1/2010 Yoshitake et al. ............ 525/478
(Continued)

FOREIGN PATENT DOCUMENTS

JP 2006-213789 A 8/2006
(Continued)

OTHER PUBLICATIONS

International Search Report for Application No. PCT/JP2012/074601 dated Jan. 23, 2013, 3 pages.
(Continued)

*Primary Examiner* — Robert S Loewe
(74) *Attorney, Agent, or Firm* — Howard & Howard Attorneys PLLC

(57) ABSTRACT

A curable silicone composition for sealing an optical semiconductor element, comprising: (A) an organopolysiloxane that has at least two silicon-bonded vinyl groups in one molecule, that has $C_{1-10}$ alkyl for the other silicon-bonded organic groups therein, and that lacks a siloxane unit represented by the following formula: $SiO_{4/2}$; (B) an organopolysiloxane represented by an average unit formula; (C) an organopolysiloxane that has at least three silicon-bonded hydrogen atoms in one molecule, that has $C_{1-10}$ alkyl for the silicon-bonded organic groups therein, and that contains from 0.7 to 1.6 mass % of silicon-bonded hydrogen atoms; and (D) a hydrosilylation reaction catalyst, wherein a viscosity at 25° C. and a viscosity at 100° C. of this composition lacking component (D) reside in a specific relationship, can efficiently perform resin sealing by transfer molding or compression molding while exhibiting an excellent moldability and can provide a cured product that has a low surface tack.

15 Claims, 1 Drawing Sheet

(51) Int. Cl.
  *C08F 30/08* (2006.01)
  *H01L 33/00* (2010.01)
  *C08L 83/04* (2006.01)

(52) U.S. Cl.
  CPC ............... *C08G 77/12* (2013.01); *C08G 77/20* (2013.01); *H01L 2224/48091* (2013.01); *H01L 2224/48247* (2013.01)
  USPC ............................ 528/32; 526/126; 264/1.24

(56) References Cited

U.S. PATENT DOCUMENTS

| | | | |
|---|---|---|---|
| 8,691,910 B2 * | 4/2014 | Hasegawa et al. ............ | 524/500 |
| 2006/0275617 A1 * | 12/2006 | Miyoshi et al. ............... | 428/448 |
| 2009/0118441 A1 * | 5/2009 | Yamamoto et al. ........... | 525/478 |
| 2010/0015407 A1 * | 1/2010 | Be et al. ........................ | 428/194 |
| 2011/0077344 A1 * | 3/2011 | Hasegawa et al. ............ | 524/500 |
| 2012/0071052 A1 * | 3/2012 | Sweet et al. .................. | 442/149 |
| 2013/0134609 A1 * | 5/2013 | Yoshitake et al. ............ | 257/791 |
| 2013/0161686 A1 * | 6/2013 | Yoshitake et al. ............ | 257/100 |

FOREIGN PATENT DOCUMENTS

| | | |
|---|---|---|
| JP | 2009-185226 A | 8/2009 |
| JP | 2006-299099 A | 11/2009 |
| WO | WO 2010/087523 A1 | 8/2010 |

OTHER PUBLICATIONS

English language abstract and machine-assisted English translation for JP 2006-213789 extracted from the PAJ database on Jun. 26, 2014, 44 pages.
English language abstract and machine-assisted English translation for JP 2006-299099 extracted from the PAJ database on Jun. 26, 2014, 47 pages.
English language abstract and machine-assisted English translation for JP 2009-185226 extracted from the PAJ database on Jun. 26, 2014, 48 pages.

* cited by examiner

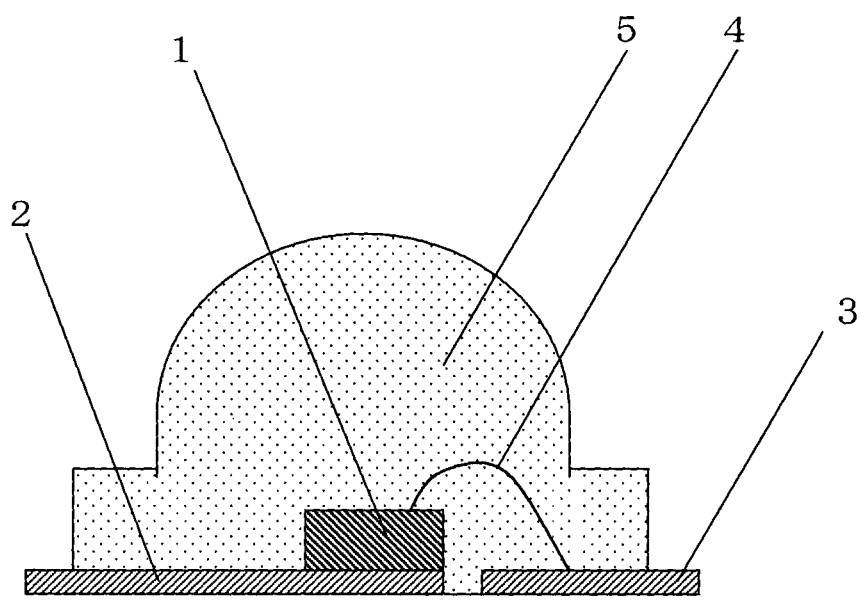

CURABLE SILICONE COMPOSITION FOR SEALING AN OPTICAL SEMICONDUCTOR ELEMENT, METHOD OF PRODUCING A RESIN-SEALED OPTICAL SEMICONDUCTOR ELEMENT, AND RESIN-SEALED OPTICAL SEMICONDUCTOR ELEMENT

CROSS-REFERENCE TO RELATED APPLICATIONS

This application is the National Stage of International Patent Application No. PCT/JP2012/074601, filed on Sep. 18, 2012, which claims priority to and all the advantages of Japanese Patent Application No. JP 2011-205480, filed on Sep. 21, 2011, the content of which is incorporated herein by reference.

TECHNICAL FIELD

The present invention relates to a curable silicone composition for sealing an optical semiconductor element, to a method of producing a resin-sealed optical semiconductor element that uses this composition, and to the resin-sealed optical semiconductor element produced by this method.

BACKGROUND ART

Curable silicone compositions are used for the resin-sealing of optical semiconductor elements, for example, photocouplers, light-emitting diodes, solid-state imaging devices, and so forth. Silicone cured product obtained from such a curable silicone composition must not absorb or scatter the light emitted from the optical semiconductor element or the light incident on the element, and, in order to improve the reliability of the resin-sealed optical semiconductor element, this cured product must also not discolor or undergo a decline in adhesiveness.

For example, Japanese Unexamined Patent Application Publication (hereinafter referred to as "Kokai") 2009-185226 provides a thermosetting silicone composition comprising: (A) an organopolysiloxane represented by the average compositional formula: $R^1{}_n(C_6H_5)_m SiO_{(4-n-m)/2}$, wherein each $R^1$ is independently a hydroxyl group, an alkoxy group, or a substituted or unsubstituted monovalent hydrocarbon group excluding unsubstituted phenyl, 30 to 90 mole % of all groups designated by $R^1$ are alkenyl groups; and n and m are positive numbers that satisfy: $0.1 \leq n < 0.8$, $0.2 \leq m < 1.9$, $1 \leq n+m < 2$, and $0.20 \leq m/(n+m) \leq 0.95$; (B) an organohydrogenpolysiloxane having at least two silicon-bonded hydrogen atoms in one molecule and represented by the average compositional formula: $R^2{}_a H_b SiO_{(4-a-b)/2}$, wherein each $R^2$ is independently a substituted or unsubstituted monovalent hydrocarbon group excluding aliphatically unsaturated hydrocarbon groups and excluding substitution by an epoxy group and excluding substitution by an alkoxy group; and a and b are positive numbers that satisfy: $0.75 \leq a \leq 2.1$, $0.01 \leq b \leq 1.0$, and $0.8 \leq a+b \leq 3.0$, in a quantity that provides a value of 0.5 to 4.0 for the molar ratio of the total amount of silicon-bonded hydrogen atoms in the composition to all silicon-bonded alkenyl groups in the composition; and (C) a hydrosilylation reaction catalyst. In addition, when this composition is subjected to measurement using a curastometer, the time to reach a torque of 1 dNm at the molding temperature from immediately after the start of the measurement is at least 5 seconds and the time to reach a torque of 20 dNm from a torque of 1 dNm at the molding temperature is not more than 2 minutes. This composition has a high hot strength at the molding temperature and can be used, for example, for injection molding; however, it undergoes a major decline in viscosity at elevated temperatures, which causes the problem of a high defect rate during transfer molding or compression molding due to the appearance of flashing and the inclusion of voids.

Kokai 2006-213789, on the other hand, provides a curable silicone composition comprising: (A) an organopolysiloxane that has on average at least 0.2 silicon-bonded alkenyl groups in one molecule; (B) an organopolysiloxane that has a three-dimensional network structure, is represented by the average unit formula: $(R'_3 SiO_{1/2})_a (SiO_{4/2})_b$, wherein each R' is independently a substituted or unsubstituted monovalent hydrocarbon group, a and b are each positive numbers, and a/b is a number from 0.2 to 3, and contains from 400 to 5,000 ppm of silicon-bonded hydroxyl groups, at 10 to 80 weight % with reference to the total amount of components (A) and (B); (C) an organohydrogenpolysiloxane that has at least two silicon-bonded hydrogen atoms in one molecule, in a quantity that provides from 0.2 to 5 moles of silicon-bonded hydrogen atoms in this component per 1 mole of the total of the silicon-bonded alkenyl groups in component (A) and the silicon-bonded alkenyl groups in component (B); and (D) a catalytic quantity of a hydrosilylation reaction catalyst.

Kokai 2006-299099 provides a resin composition for sealing an optical semiconductor element, in the form of an addition-curable silicone resin composition in which the essential components are (A) an organosilicon compound that has in one molecule at least two noncovalent bonding double bond groups and that contains at least 30 to 100 mass %, with reference to component (A) as a whole, of an organopolysiloxane represented by the average compositional formula: $(R^1 SiO_{3/2})_a (R^2 R^3 SiO)_b (R^4 R^5 R^6 SiO_{1/2})_c (SiO_{4/2})_d$, wherein $R^1$ to $R^6$ each independently represent a monovalent hydrocarbon group, from 1 to 50 mole % of all monovalent hydrocarbon groups are groups containing a noncovalent bonding double bond; and a, b, c, and d are positive numbers that represent the molar ratios of the individual siloxane units wherein $a/(a+b+c+d)=0.40$ to 0.95, $b/(a+b+c+d)=0.05$ to 0.60, $c/(a+b+c+d)=0$ to 0.05, $d/(a+b+c+d)=0$ to 0.10, and $a+b+c+d=1.0$; (B) an organohydrogenpolysiloxane that has at least two silicon-bonded hydrogen atoms in one molecule; and (C) a platinum-type catalyst in a catalytic amount, wherein the organopolysiloxanes of components (A) and (B) do not contain the silanol group.

These compositions are known to exhibit a smaller decline in viscosity at elevated temperatures than curable silicone compositions that contain a high phenyl group concentration; however, when the branched polymer content is raised in order to obtain a hardness high enough to provide a satisfactory mechanical strength and a low surface tack, a large viscosity decline occurs and the viscosity declines at elevated temperatures just as for the curable silicone compositions that contain a high phenyl group concentration. The same problems as described above then occur in transfer molding and compression molding.

An object of the present invention is to provide a curable silicone composition for sealing an optical semiconductor element wherein the composition can efficiently perform resin sealing by transfer molding or compression molding while exhibiting an excellent moldability and can provide a cured product that has a low surface tack.

A further object of the present invention is to provide a method that efficiently carries out the resin sealing of an optical semiconductor element using this composition and that does so while exhibiting an excellent moldability.

Another object of the present invention is to provide an optical semiconductor element that is obtained by this method and that exhibits a low surface tack, little flashing, and few voids.

DISCLOSURE OF INVENTION

The curable silicone composition of the present invention for sealing an optical semiconductor element characteristically comprises:
(A) an organopolysiloxane that has a viscosity at 25° C. of 50 to 100,000 mPa·s, that has at least two silicon-bonded vinyl groups in one molecule, that has $C_{1-10}$ alkyl for the other silicon-bonded organic groups therein, and that lacks a siloxane unit represented by the following formula: $SiO_{4/2}$;
(B) an organopolysiloxane represented by the following average unit formula:

$$(ViR_2SiO_{1/2})_a(R_3SiO_{1/2})_b(SiO_{4/2})_c(HO_{1/2})_d$$

wherein Vi is a vinyl group; each R is independently a $C_{1-10}$ alkyl group; and a, b, c, and d are each positive numbers that satisfy: a+b+c=1, a/(a+b)=0.15 to 0.35, c/(a+b+c)= 0.53 to 0.62, and d/(a+b+c)=0.005 to 0.03, at from 15 to 35 mass % of the total of components (A) and (B);
(C) an organopolysiloxane that has at least three silicon-bonded hydrogen atoms in one molecule, that has $C_{1-10}$ alkyl for the silicon-bonded organic groups therein, and that contains from 0.7 to 1.6 mass % of silicon-bonded hydrogen atoms, in a quantity that provides from 0.8 to 2.0 moles of silicon-bonded hydrogen atoms in this component per 1 mole of the total vinyl groups in components (A) and (B); and
(D) a hydrosilylation reaction catalyst, in a quantity sufficient to cure the present composition,
wherein a viscosity at 25° C. of this composition lacking component (D) is from 3,000 to 10,000 mPa·s and, letting $\eta_{25° C.}$ be this viscosity in mPa·s and letting $\eta_{100° C.}$ be a viscosity in mPa·s at 100° C. of this composition lacking component (D), a value of the following formula:

$$Log_{10}\eta_{100° C.}/Log_{10}\eta_{25° C.}$$

is 0.830 to 0.870.

This composition preferably cures to form a silicone cured product that has a type A durometer hardness as specified in JIS K 6253 of from 60 to 80.

The method of the present invention for producing a resin-sealed optical semiconductor element is characterized by performing, at a temperature that yields a gel time of 30 to 120 seconds by the hot plate method specified in JIS C 2105, the resin-sealing of an optical semiconductor element by transfer molding or compression molding using the above-described curable silicone composition for sealing an optical semiconductor element.

The resin-sealed optical semiconductor element of the present invention is characteristically produced by the preceding method.

Effects of Invention

The curable silicone composition of the present invention for sealing optical semiconductor elements characteristically can efficiently perform the resin sealing of an optical semiconductor element by transfer molding or compression molding while exhibiting an excellent moldability and can provide a cured product that has a low surface tack. In addition, the method of the present invention for producing a resin-sealed optical semiconductor element characteristically can efficiently carry out the resin sealing of an optical semiconductor element and can do so while exhibiting an excellent moldability. The resin-sealed optical semiconductor element of the present invention characteristically exhibits a low surface tack, little flashing, and few voids.

BRIEF DESCRIPTION OF THE DRAWINGS

FIG. 1 is a cross-sectional view of an LED that is an example of an optical semiconductor element of the present invention.

DETAILED DESCRIPTION OF THE INVENTION

The curable silicone composition of the present invention for sealing optical semiconductor elements will be described in detail first.

Component (A) imparts a suitable flexibility to a silicone cured product obtained by curing the present composition and is an organopolysiloxane that has at least two silicon-bonded vinyl groups in one molecule, that has $C_{1-10}$ alkyl for the other silicon-bonded organic groups, therein, and that lacks a siloxane unit represented by the formula: $SiO_{4/2}$. Silicon-bonded organic groups other than vinyl groups in this component are $C_{1-10}$ alkyl and can be specifically exemplified by straight-chain alkyl groups such as methyl, ethyl, propyl, and butyl; branched alkyl groups such as isopropyl and tertiary-butyl; and cycloalkyl groups such as cyclopentyl and cyclohexyl. This component has a viscosity at 25° C. in the range from 50 to 100,000 mPa·s while the range from 300 to 50,000 mPa·s is preferred because it provides excellent handling characteristics for this composition and provides an excellent mechanical strength for the silicone cured product obtained by curing this composition. There are no particular limitations on the molecular structure of component (A), and the molecular structure of component (A) can be exemplified by straight chain, partially branched straight chain, and branched chain.

Component (A) can be exemplified by the following organopolysiloxanes. In these formulas, Vi represents a vinyl group and Me represents a methyl group.

$ViMe_2SiO(Me_2SiO)_{160}SiMe_2Vi$ $ViMe_2SiO(Me_2SiO)_{310}SiMe_2Vi$ $ViMe_2SiO(Me_2SiO)_{515}SiMe_2Vi$ $ViMe_2SiO(Me_2SiO)_{800}SiMe_2Vi$ $Me_3SiO(Me_2SiO)_{140}(MeViSiO)_{20}SiMe_3$ $ViMe_2SiO(Me_2SiO)_{500}(MeViSiO)_{15}SiMe_2Vi$ $ViMe_2SiO(Me_2SiO)_{780}(MeViSiO)_{20}SiMe_2Vi$ $MeSi\{O(Me_2SiO)_{80}SiMe_2Vi\}_3$ $Si\{O(Me_2SiO)_{60}SiMe_2Vi\}_4$

Component (B) imparts a suitable hardness and mechanical strength to the silicone cured product obtained by curing the present composition and is an organopolysiloxane represented by the following average unit formula:

$$(ViR_2SiO_{1/2})_a(R_3SiO_{1/2})_b(SiO_{4/2})_c(HO_{1/2})_d$$

Vi in this formula is a vinyl group. In addition, each R in the formula is independently a $C_{1-10}$ alkyl group and can be specifically exemplified by straight-chain alkyl groups such as methyl, ethyl, propyl, and butyl; branched alkyl groups such as isopropyl and tertiary-butyl; and cycloalkyl groups such as cyclopentyl and cyclohexyl. a, b, c, and d in the formula are each positive numbers that satisfy: a+b+c=1, a/(a+b)=0.15 to 0.35, c/(a+b+c)=0.53 to 0.62, and d/(a+b+c)=0.005 to 0.03. a/(a+b) is a number in the range from 0.15 to 0.35, and is preferably a number in the range from 0.2 to 0.3 in order to provide the present composition with a satisfactory curability. c/(a+b+c) is a number in the range from 0.53 to 0.62, and is preferably a number in the range from 0.55 to 0.60 in order to provide the silicone cured product obtained by curing the present composition with a satisfactory hardness and mechanical strength. d/(a+b+c) is a number in the range from 0.005 to 0.03, and is preferably a number in the range from 0.01 to 0.025 in order to provide the silicone cured product obtained by curing the present composition with a satisfactory adhesiveness and mechanical strength.

Component (B) can be exemplified by the following organopolysiloxanes. In these formulas, Vi represents a vinyl group and Me represents a methyl group.

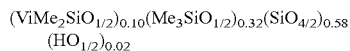

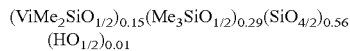

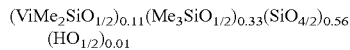

The component (B) content is in the range from 15 to 35 mass % of the total amount of components (A) and (B). The component (B) content is preferably in the range from 20 to 30 mass % because this can prevent a substantial increase in the viscosity of the present composition at 25° C., can prevent a substantial decline in viscosity at 100° C., and can provide the silicone cured product obtained by curing the present composition with a suitable hardness and mechanical strength. There are no particular limitations on the content of the total amount of components (A) and (B), but this content, expressed with reference to the total amount of components (A), (B), (C), and (D), is preferably at least 80 mass % and particularly preferably is at least 90 mass %.

Component (C) functions to cure the present composition and is an organopolysiloxane that has at least three silicon-bonded hydrogen atoms in one molecule and has $C_{1-10}$ alkyl for its silicon-bonded organic groups. The silicon-bonded organic groups in this component are $C_{1-10}$ alkyl and can be specifically exemplified by straight-chain alkyl groups such as methyl, ethyl, propyl, and butyl; branched alkyl groups such as isopropyl and tertiary-butyl; and cycloalkyl groups such as cyclopentyl and cyclohexyl. This component contains from 0.7 to 1.6 mass % of silicon-bonded hydrogen atoms. The reasons for this are as follows: a lower silicon-bonded hydrogen atom content results in a reduced hardness and an inadequate adhesiveness for the silicone cured product obtained by curing the present composition; a larger content results in a reduced mechanical strength for the silicone cured product obtained by curing the present composition and/or in an excessively elevated hardness. There are no particular limitations on the viscosity of component (C), but its viscosity at 25° C. is preferably in the range from 1 to 10,000 mPa·s, more preferably in the range from 1 to 5,000 mPa·s, and particularly preferably in the range from 5 to 1,000 mPa·s, because this provides excellent mechanical properties for the silicone cured product obtained by curing the present composition and provides an excellent filling behavior for the present composition.

Component (C) can be exemplified by the following organopolysiloxanes. Me represents a methyl group in these formulas.

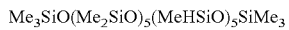

The component (C) content is a quantity that provides from 0.8 to 2.0 moles of silicon-bonded hydrogen atoms in this component and preferably is a quantity that provides from 0.9 to 1.8 moles, in each case per 1 mole of the total amount of vinyl groups present in components (A) and (B). The reasons for this are as follows: the resulting composition has an excellent curability when the component (C) content is at least as large as the lower limit on the indicated range, while the mechanical properties and heat resistance of the resulting cured product are excellent at less than or equal to the upper limit on the indicated range.

Component (D) is a hydrosilylation reaction catalyst for accelerating the cure of the present composition. Component (D) can be exemplified by platinum catalysts, rhodium catalysts, and palladium catalysts, and platinum catalysts are preferred because they can substantially accelerate the cure of the present composition. These platinum catalysts can be exemplified by finely divided platinum powder, chloroplatinic acid, alcohol solutions of chloroplatinic acid, platinum-alkenylsiloxane complexes, platinum-olefin complexes, and platinum-carbonyl complexes, with platinum-alkenylsiloxane complexes being particularly preferred. The alkenylsiloxane can be exemplified by 1,3-divinyl-1,1,3,3-tetramethyldisiloxane and 1,3,5,7-tetramethyl-1,3,5,7-tetravinylcyclotetrasiloxane, 1,3-divinyl-1,1,3,3-tetramethyldisiloxane is particularly preferred because the corresponding platinum-alkenylsiloxane complex has an excellent stability. Moreover, the stability of this platinum-alkenylsiloxane complex can be enhanced by the addition to the complex of an alkenylsiloxane such as 1,3-divinyl-1,1,3,3-tetramethyldisiloxane, 1,3-diallyl-1,1,3,3-tetramethyldisiloxane, 1,3,5,7-tetramethyl-1,3,5,7-tetravinylcyclotetrasiloxane, and so forth, or an organosiloxane oligomer such as a dimethylsiloxane oligomer and so forth, and this addition is therefore preferred; the addition of an alkenylsiloxane is particularly preferred.

The component (D) content should be an amount that accelerates the cure of the present composition but is not otherwise particularly limited, and in specific terms is preferably an amount that provides from 0.01 to 500 mass-ppm of the metal atom in this component with reference to the present composition and is particularly preferably an amount that provides from 0.01 to 50 mass-ppm of the metal atom in this component with reference to the present composition. The reasons for this are as follows: the present composition exhibits an excellent curability when the component (D) content is at least as large as the lower limit on the indicated range, while the appearance of problems such as discoloration of the resulting cured product is inhibited at less than or equal to the upper limit on the indicated range.

The present composition may contain a reaction inhibitor as an additional optional component, for example, an alkyne alcohol such as 2-methyl-3-butyn-2-ol, 3,5-dimethyl-1-hexyn-3-ol, and 2-phenyl-3-butyn-2-ol; an ene-yne compound such as 3-methyl-3-penten-1-yne and 3,5-dimethyl-3-hexen-1-yne; as well as 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. While there are no limitations on the content of this reaction inhibitor, its content is preferably in the range from 0.0001 to 5 parts by mass per 100 parts by mass of the total amount of components (A) and (B).

The present composition may also contain an adhesion promoter in order to improve its adhesiveness. This adhesion promoter is preferably an organosilicon compound that has at least one silicon-bonded alkoxy group in one molecule. This alkoxy group can be exemplified by methoxy, ethoxy, propoxy, butoxy, and methoxyethoxy wherein methoxy is particularly preferred. Groups bonded to the silicon other than alkoxy groups in these organosilicon compounds can be exemplified by substituted and unsubstituted monovalent hydrocarbon groups, e.g., alkyl, alkenyl, aryl, aralkyl, and halogenated alkyl; by epoxy group-containing monovalent organic groups, e.g., 3-glycidoxypropyl, 4-glycidoxybutyl, or similar glycidoxyalkyl groups; 2-(3,4-epoxycyclohexyl)ethyl, 3-(3,4-epoxycyclohexyl)propyl, or similar epoxycyclohexylalkyl groups; and 4-oxiranylbutyl, 8-oxiranyloctyl, or similar oxiranylalkyl groups; by acrylic group-containing monovalent organic groups such as 3-methacryloxypropyl; and by the hydrogen atom. This organosilicon compound preferably has a group capable of reacting with the alkenyl or the silicon-bonded hydrogen in the present composition and specifically preferably has a silicon-bonded alkenyl group or a silicon-bonded hydrogen atom. In addition, this organosilicon compound preferably has at least one epoxy group-containing monovalent organic group in one molecule because this can impart an excellent adhesiveness for a variety of substrates. This organosilicon compound can be exemplified by organosilane compounds, organosiloxane oligomers, and alkyl silicates. The molecular structure of the organosiloxane oligomer and the alkyl silicate can be exemplified by straight chain, partially branched straight chain, branched chain, cyclic, and network with straight chain, branched chain, and network being preferred. This organosilicon compound can be exemplified by a silane compound such as 3-glycidoxypropyltrimethoxysilane, 2-(3,4-epoxycyclohexyl)ethyltrimethoxysilane, and 3-methacryloxypropyltrimethoxysilane; a siloxane compound having in each molecule at least one silicon-bonded alkenyl group or silicon-bonded hydrogen atom and at least one silicon-bonded alkoxy group; a mixture of a silane compound or siloxane compound that has at least one silicon-bonded alkoxy group with a siloxane compound that has in one molecule at least one silicon-bonded hydroxy group and at least one silicon-bonded alkenyl group; a methyl polysilicate; an ethyl polysilicate; and an epoxy group-containing ethyl polysilicate. This adhesion promoter preferably takes the form of a low-viscosity fluid, and, while there are no limitations on its viscosity, a viscosity at 25° C. in the range from 1 to 500 mPa·s is preferred. There are no limitations on the content of this adhesion promoter in the composition under consideration, but the range of 0.01 to 10 parts by mass per 100 parts by mass of the total amount of the present composition is preferred.

Insofar as the objects of the present invention are not impaired, the present composition may also contain the following, for example, as additional optional components: an inorganic filler such as silica, glass, alumina, zinc oxide, and so forth; a finely divided powder of an organic resin such as a polymethacrylate resin and so forth; a heat stabilizer; a dye; a pigment; a flame retardant; a solvent; and so forth.

The present composition is characterized in that a viscosity at 25° C. of the composition lacking component (D), that is, the composition composed of components (A), (B), and (C), is in the range from 3,000 to 10,000 mPa·s, and in that, letting $\eta_{25°\,C.}$ be this viscosity in mPa·s and letting $\eta_{100°\,C.}$ be a viscosity in mPa·s at 100° C. of the composition composed of components (A), (B), and (C), a value of the following formula:

$$\mathrm{Log}_{10}\eta_{100°\,C.}/\mathrm{Log}_{10}\eta_{125°\,C.}$$

is 0.830 to 0.870 and preferably 0.840 to 0.860. The reasons for this are as follows: the appearance of flashing is inhibited and a good moldability is obtained when this value is at least as large as the lower limit for the indicated range, while an excellent mold filling behavior and an excellent moldability are obtained at less than or equal to the upper limit for the indicated range.

While there are no particular limitations on the hardness of the silicone cured product obtained by curing the present composition, a type A durometer hardness specified in JIS 6253 is in the range from 60 to 80 and preferably in the range from 65 to 75. The reasons for this are as follows: when the hardness of the silicone cured product is at least as large as the lower limit for the indicated range, the silicone cured product exhibits little surface tack, adhesion between individual resin-sealed optical semiconductor elements is inhibited, and the adhesion of dust to the surface of the sealing resin can be inhibited; on the other hand, at less than or equal to the upper limit on the indicated range, the silicone cured product has excellent mechanical characteristics and the appearance of cracking in the sealing resin, for example, during a mounting or packaging operation at elevated temperature, can be inhibited.

The method of the present invention for producing a resin-sealed optical semiconductor element is described in detail in the following.

The sealing resin used by this method is the hereinabove-described curable silicone composition for sealing an optical semiconductor element. This method is characterized in that the resin-sealing of an optical semiconductor element is performed, at a temperature that yields a gel time in the range from 30 to 120 seconds and preferably 45 to 90 seconds by the hot plate method specified in JIS C 2105, by transfer molding or compression molding using the curable silicone composition for sealing an optical semiconductor element. An excellent mold filling behavior during molding is obtained when the gel time is at least as large as the lower limit for the range given above, while the molding time is shortened and the productivity is then improved when the gel time is less than or equal to the upper limit for this range.

Viewed from a productivity standpoint, the molding temperature is preferably in the range from 80° C. to 200° C. and particularly preferably is in the range from 100° C. to 150° C. The gel time at these molding temperatures can be adjusted into the range from 30 to 120 seconds and preferably 45 to 90 seconds by adjusting the component (D) content and the reaction inhibitor content in the curable silicone composition for sealing optical semiconductor elements.

The resin-sealed optical semiconductor element of the present invention is described in detail in the following.

The resin-sealed optical semiconductor element of the present invention is a resin-sealed optical semiconductor element that has been produced by the method described above. The optical semiconductor element here can be exemplified by light-emitting diodes (LEDs).

FIG. 1 shows a cross-sectional view of a surface-mount LED that is an example of the present semiconductor element. In the LED shown in FIG. 1, an optical semiconductor element 1 is die-bonded on a lead frame 2 and this optical semiconductor element 1 is wire-bonded to the lead frame 3 by a bonding wire 4. This optical semiconductor element 1 is resin-sealed by a silicone cured product 5 that is formed by the curable silicone composition of the present invention for sealing optical semiconductor elements.

The method of producing the surface-mount LED shown in FIG. 1 can be exemplified by a method in which the optical semiconductor element 1 is die-bonded to the lead frame 2; the optical semiconductor element 1 is wire-bonded to the lead frame 3 with a gold bonding wire 4; and resin sealing is then performed by transfer molding or compression molding the curable silicone composition of the present invention for sealing optical semiconductor elements, onto the optical semiconductor element 1 at a molding temperature that provides a gel time therefor in the range from 30 to 120 seconds and preferably from 45 to 90 seconds.

EXAMPLES

The curable silicone composition of the present invention for sealing optical semiconductor elements, the method according to the present invention for producing a resin-sealed optical semiconductor element, and the resin-sealed optical semiconductor element according to the present invention are described in greater detail using Practical Examples and Comparative Examples. The viscosity is the value at 25° C. In the formulas, Me represents a methyl group and Vi represents a vinyl group.

[Viscosity]

The viscosity at 25° C. and the viscosity at 100° C. of the hydrosilylation reaction catalyst-free composition corresponding to the curable silicone composition for sealing optical semiconductor elements were both measured using an Advanced Rheometer AR550 from TA Instruments.

[Gel Time]

The gel time at 120° C. of the curable silicone composition for sealing optical semiconductor elements was measured based on JIS C 2105-1992, "Test methods for solventless liquid resins for electrical insulation", using a Rheometer MDR 2000P from Alpha Technologies.

[Hardness of the Silicone Cured Product]

Using the type A durometer specified in JIS K 6253-1997, "Rubber, vulcanized or thermoplastic—Determination of hardness", the hardness was measured on the silicone cured product provided by heating the curable silicone composition for sealing optical semiconductor elements for 2 hours at 150° C.

[Moldability]

The composition was molded for 3 minutes at 120° C. onto a flat alumina ceramic substrate using a transfer molding machine, followed by inspection for the presence/absence of voids in the obtained molding and the presence/absence of flashing.

Practical Example 1

A curable silicone composition was prepared by mixing the following to uniformity: 25.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01};$$

44.50 parts by mass of a dimethylpolysiloxane represented by the formula:

$$ViMe_2SiO(Me_2SiO)_{515}SiMe_2Vi;$$

26.06 parts by mass of a dimethylpolysiloxane represented by the formula:

$$ViMe_2SiO(Me_2SiO)_{160}SiMe_2Vi;$$

4.30 parts by mass of a methylhydrogenpolysiloxane represented by the formula:

$$Me_3SiO(MeHSiO)_{50}SiMe_3,$$

in a quantity that provided 1.5 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.04 parts by mass of 3,5-dimethyl-1-hexyn-3-ol.

Practical Example 2

A curable silicone composition was prepared by mixing the following to uniformity: 30.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01},$$

45.00 parts by mass of a dimethylpolysiloxane represented by the formula:

$$ViMe_2SiO(Me_2SiO)_{515}SiMe_2Vi;$$

10.00 parts by mass of a dimethylpolysiloxane represented by the formula:

$$ViMe_2SiO(Me_2SiO)_{310}SiMe_2Vi;$$

10.56 parts by mass of a dimethylpolysiloxane represented by the formula:

$$ViMe_2SiO(Me_2SiO)_{160}SiMe_2Vi;$$

4.30 parts by mass of a methylhydrogenpolysiloxane represented by the formula:

$$Me_3SiO(MeHSiO)_{50}SiMe_3,$$

in a quantity that provided 1.3 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.04 parts by mass of 3,5-dimethyl-1-hexyn-3-ol.

Practical Example 3

A curable silicone composition for sealing optical semiconductor elements was prepared by mixing the following to uniformity: 20.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01};$$

30.00 parts by mass of a dimethylpolysiloxane represented by the formula:

$$ViMe_2SiO(Me_2SiO)_{515}SiMe_2Vi;$$

45.19 parts by mass of a dimethylpolysiloxane represented by the formula:

$$ViMe_2SiO(Me_2SiO)_{310}SiMe_2Vi;$$

4.66 parts by mass of a methylhydrogenpolysiloxane represented by the formula:

$$Me_3SiO(MeHSiO)_{14}SiMe_3,$$

in a quantity that provided 1.8 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.05 parts by mass of 3,5-dimethyl-1-hexyn-3-ol.

Practical Example 4

A curable silicone composition for sealing optical semiconductor elements was prepared by mixing the following to uniformity: 25.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01};$$

37.50 parts by mass of a dimethylpolysiloxane represented by the formula:

$$ViMe_2SiO(Me_2SiO)_{515}SiMe_2Vi;$$

23.37 parts by mass of a dimethylpolysiloxane represented by the formula:

$$ViMe_2SiO(Me_2SiO)_{310}SiMe_2Vi;$$

10.00 parts by mass of a dimethylpolysiloxane represented by the formula:

$$ViMe_2SiO(Me_2SiO)_{160}SiMe_2Vi;$$

4.00 parts by mass of a methylhydrogenpolysiloxane represented by the formula:

$$Me_3SiO(MeHSiO)_{50}SiMe_3,$$

in a quantity that provided 1.4 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.03 parts by mass of 3,5-dimethyl-1-hexyn-3-ol.

Comparative Example 1

A curable silicone composition for sealing optical semiconductor elements was prepared by mixing the following to uniformity: 15.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01};$$

23.00 parts by mass of a dimethylpolysiloxane represented by the formula:

$$ViMe_2SiO(Me_2SiO)_{515}SiMe_2Vi;$$

58.20 parts by mass of a dimethylpolysiloxane represented by the formula:

$$ViMe_2SiO(Me_2SiO)_{310}SiMe_2Vi;$$

3.67 parts by mass of a methylhydrogenpolysiloxane represented by the formula:

$$Me_3SiO(MeHSiO)_{50}SiMe_3,$$

in a quantity that provided 2.0 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.03 parts by mass of 3,5-dimethyl-1-hexyn-3-ol.

Comparative Example 2

A curable silicone composition for sealing optical semiconductor elements was prepared by mixing the following to uniformity: 15.00 parts by mass of an organopolysiloxane represented by the average unit formula:

$$(ViMe_2SiO_{1/2})_{0.04}(Me_3SiO_{1/2})_{0.4}(SiO_{4/2})_{0.56}(HO_{1/2})_{0.01};$$

20.00 parts by mass of an organopolysiloxane represented by the formula:

$$(ViMe_2SiO_{1/2})_{0.15}(Me_3SiO_{1/2})_{0.47}(SiO_{4/2})_{0.38}(HO_{1/2})_{0.0001};$$

10.00 parts by mass of a dimethylpolysiloxane represented by the formula:

$$ViMe_2SiO(Me_2SiO)_{515}SiMe_2Vi;$$

49.36 parts by mass of a dimethylpolysiloxane represented by the formula:

$$ViMe_2SiO(Me_2SiO)_{160}SiMe_2Vi;$$

5.5 parts by mass of a methylhydrogenpolysiloxane represented by the formula:

$$Me_3SiO(MeHSiO)_{50}SiMe_3,$$

in a quantity that provided 1.5 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.04 parts by mass of 3,5-dimethyl-1-hexyn-3-ol.

Comparative Example 3

A curable silicone composition for sealing optical semiconductor elements was prepared by mixing the following to uniformity: 45.00 parts by mass of an organopolysiloxane represented by the average unit formula:

$$(ViMe_2SiO_{1/2})_{0.06}(Me_3SiO_{1/2})_{0.44}(SiO_{4/2})_{0.50}(HO_{1/2})_{0.01};$$

18.00 parts by mass of a dimethylpolysiloxane represented by the formula:

$$ViMe_2SiO(Me_2SiO)_{515}SiMe_2Vi;$$

19.70 parts by mass of a dimethylpolysiloxane represented by the formula:

$$ViMe_2SiO(Me_2SiO)_{310}SiMe_2Vi;$$

13.55 parts by mass of a dimethylpolysiloxane represented by the formula:

$$ViMe_2SiO(Me_2SiO)_{160}SiMe_2Vi;$$

3.60 parts by mass of a methylhydrogenpolysiloxane represented by the formula:

$$Me_3SiO(MeHSiO)_{14}SiMe_3,$$

in a quantity that provided 1.2 moles of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.05 part by mass of 3,5-dimethyl-1-hexyn-3-ol.

Comparative Example 4

A curable silicone composition for sealing optical semiconductor elements was prepared by mixing the following to uniformity: 35.00 parts by mass of an organopolysiloxane represented by the average unit formula:

$$(ViMe_2SiO_{1/2})_{0.11}(Me_3SiO_{1/2})_{0.33}(SiO_{4/2})_{0.56}(HO_{1/2})_{0.01};$$

25.00 parts by mass of a dimethylpolysiloxane represented by the formula:

$$ViMe_2SiO(Me_2SiO)_{515}SiMe_2Vi;$$

35.94 parts by mass of a dimethylpolysiloxane represented by the formula:

$$ViMe_2SiO(Me_2SiO)_{160}SiMe_2Vi;$$

3.93 parts by mass of a methylhydrogenpolysiloxane represented by the formula:

$$Me_3SiO(MeHSiO)_{50}SiMe_3,$$

in a quantity that provided 1.0 mole of silicon-bonded hydrogen atoms in this component per 1 mole of the total amount of silicon-bonded vinyl groups in the preceding polysiloxanes; 0.10 parts by mass of a 1,3-divinyltetramethyldisiloxane solution of a platinum/1,3-divinyltetramethyldisiloxane complex, which contains approximately 6,000 ppm platinum metal; and 0.03 parts by mass 3,5-dimethyl-1-hexyn-3-ol.

TABLE 1

| | classification | | | | | | | |
|---|---|---|---|---|---|---|---|---|
| | present invention | | | | comparative example | | | |
| item | Practical Example 1 | Practical Example 2 | Practical Example 3 | Practical Example 4 | Comp. Example 1 | Comp. Example 2 | Comp. Example 3 | Comp. Example 4 |
| η25° C. (mPa·s) | 3590 | 6050 | 3800 | 4600 | 3140 | 860 | 3150 | 6400 |
| η100° C. (mPa·s) | 980 | 1550 | 1170 | 1300 | 1030 | 370 | 650 | 1400 |
| $Log_{10}\,\eta_{100°\,C.}/Log_{10}\,\eta_{25°\,C.}$ | 0.841 | 0.844 | 0.857 | 0.850 | 0.862 | 0.875 | 0.804 | 0.827 |
| gel time at 120° C. (sec) | 75 | 76 | 108 | 50 | 54 | 77 | 110 | 40 |
| type A durometer hardness | 71 | 74 | 61 | 67 | 56 | 66 | 69 | 74 |
| moldability | excellent | excellent | excellent | excellent | poor (unsatisfactory hardness) | poor (inclusion of voids) | poor (appearance of flashing) | poor (appearance of flashing) |

INDUSTRIAL APPLICABILITY

The curable silicone composition of the present invention for sealing optical semiconductor elements, because it forms a flexible and highly transparent silicone cured product that is free of surface tack, is well adapted for application as a sealant for optical semiconductor elements that emit light, e.g., visible light, infrared light, ultraviolet light, far ultraviolet light, and so forth. In particular, the silicone cured product provided by the cure of the curable silicone composition of the present invention for sealing optical semiconductor elements does not undergo temperature-induced changes in transparency and is thus well adapted for application as a sealant for high-energy, high-output optical semiconductor elements.

DESCRIPTION OF SYMBOLS 1 optical semiconductor element
2 lead frame
3 lead frame
4 bonding wire
5 silicone cured product

The invention claimed is:

1. A curable silicone composition for sealing an optical semiconductor element, the composition comprising:
   (A) an organopolysiloxane that has a viscosity at 25° C. of 50 to 100,000 mPa·s, that has at least two silicon-bonded vinyl groups in one molecule, that has $C_{1-10}$ alkyl for the other silicon-bonded organic groups therein, and that lacks a siloxane unit represented by the following formula: $SiO_{4/2}$;
   (B) an organopolysiloxane represented by the following average unit formula:

$$(ViR_2SiO_{1/2})_a(R_3SiO_{1/2})_b(SiO_{4/2})_c(HO_{1/2})_d$$

wherein Vi is a vinyl group; each R is independently a $C_{1-10}$ alkyl group; and a, b, c, and d are each positive numbers that satisfy: a+b+c=1, a/(a+b)=0.15 to 0.35, c/(a+b+c)=0.53 to 0.62, and d/(a+b+c)=0.005 to 0.03, at from 15 to 35 mass % of the total of components (A) and (B);
   (C) an organopolysiloxane that has at least three silicon-bonded hydrogen atoms in one molecule, that has $C_{1-10}$ alkyl for the silicon-bonded organic groups therein, and that contains from 0.7 to 1.6 mass % of silicon-bonded hydrogen atoms, in a quantity that provides from 0.8 to 2.0 moles silicon-bonded hydrogen atoms in this component per 1 mole of the total vinyl groups in components (A) and (B); and
   (D) a hydrosilylation reaction catalyst, in a quantity sufficient to cure the composition;

wherein a viscosity at 25° C. of the composition lacking component (D) is from 3,000 to 10,000 mPa·s and, letting $\eta_{25°\,C.}$ be this viscosity in mPa·s and letting $\eta_{100°\,C.}$ be a viscosity in mPa·s at 100° C. of the composition lacking component (D), a value of the following formula: $Log_{10}\,\eta_{100°\,C.}/Log_{10}\,\eta_{25°\,C.}$ is 0.830 to 0.870.

2. The composition according to claim 1, that cures to form a silicone cured product that has a type A durometer hardness as specified in JIS K 6253 of from 60 to 80.

3. A method of producing a resin-sealed optical semiconductor element, the method comprising resin-sealing an optical semiconductor element using the composition according to claim 1 to produce the resin-sealed optical semiconductor element, wherein resin-sealing occurs at a temperature that yields a gel time of 30 to 120 seconds by the hot plate method specified in JIS C 2105.

4. A resin-sealed optical semiconductor element produced by the method according to claim 3.

5. The method according to claim 3, wherein resin-sealing is accomplished by transfer molding the composition according to claim 1.

6. The method according to claim 3, wherein resin-sealing is accomplished by compression molding the composition according to claim 1.

7. The method according to claim 3, wherein the optical semiconductor element is a light emitting diode (LED).

8. The composition according to claim 1, wherein component (A) comprises at least one of the following organopol ysiloxanes, with Vi representing a vinyl group and Me representing a methyl group:

$ViMe_2SiO(Me_2SiO)_{160}SiMe_2Vi$;

$ViMe_2SiO(Me_2SiO)_{310}SiMe_2Vi$;

$ViMe_2SiO(Me_2SiO)_{515}SiMe_2Vi$;

$ViMe_2SiO(Me_2SiO)_{800}SiMe_2Vi$;

$Me_3SiO(Me_2SiO)_{140}(MeViSiO)_{20}SiMe_3$;

$ViMe_2SiO(Me_2SiO)_{500}(MeViSiO)_{15}SiMe_2Vi$;

$ViMe_2SiO(Me_2SiO)_{780}(MeViSiO)_{20}SiMe_2Vi$;

$MeSi\{O(Me_2SiO)_{80}SiMe_2Vi\}_3$; and $Si\{O(Me_2SiO)_{60}SiMe_2Vi\}_4$.

9. The composition according to claim 8, wherein component (B) comprises at least one of the following organopolysiloxanes, with Vi representing a vinyl group and Me representing a methyl group:

$(ViMe_2SiO_{1/2})_{0.10}(Me_3SiO_{1/2})_{0.32}(SiO_{4/2})_{0.58}(HO_{1/2})_{0.02}$;

$(ViMe_2SiO_{1/2})_{0.15}(Me_3SiO_{1/2})_{0.29}(SiO_{4/2})_{0.56}(HO_{1/2})_{0.01}$; and $(ViMe_2SiO_{1/2})_{0.11}(Me_3SiO_{1/2})_{0.33}(SiO_{4/2})_{0.56}(HO_{1/2})_{0.01}$.

10. The composition according to claim 9, wherein component (C) comprises at least one of the following organopolysiloxanes, with Me representing a methyl group:

$Me_3SiO(Me_2SiO)_5(MeHSiO)_5SiMe_3$;

$Me_3SiO(MeHSiO)_{14}SiMe_3$; and $Me_3SiO(MeHSiO)_{50}SiMe_3$.

11. The composition according to claim 1, wherein component (B) comprises at least one of the following organopolysiloxanes, with Vi representing a vinyl group and Me representing a methyl group:

$(ViMe_2SiO_{1/2})_{0.10}(Me_3SiO_{1/2})_{0.32}(SiO_{4/2})_{0.58}(HO_{1/2})_{0.02}$;

$(ViMe_2SiO_{1/2})_{0.15}(Me_3SiO_{1/2})_{0.29}(SiO_{4/2})_{0.56}(HO_{1/2})_{0.01}$; and $(ViMe_2SiO_{1/2})_{0.11}(Me_3SiO_{1/2})_{0.33}(SiO_{4/2})_{0.56}(HO_{1/2})_{0.01}$.

12. The composition according to claim 1, wherein component (C) comprises at least one of the following organopolysiloxanes, with Me representing a methyl group:

$Me_3SiO(Me_2SiO)_5(MeHSiO)_5SiMe_3$;

$Me_3SiO(MeHSiO)_{14}SiMe_3$; and $Me_3SiO(MeHSiO)_{50}SiMe_3$.

13. The composition according to claim 1, wherein $Log_{10} \eta_{100° C.}/Log_{10} \eta_{25° C.}$ is 0.840 to 0.860.

14. The composition according to claim 1, further comprising:
  i) a reaction inhibitor;
  ii) an adhesion promoter; or
  iii) both i) and ii).

15. A silicone cured product formed from the composition according to claim 1, wherein the product has a type A durometer hardness as specified in JIS K 6253 of from 60 to 80.

* * * * *